United States Patent
Lee et al.

(10) Patent No.: US 10,157,855 B2
(45) Date of Patent: Dec. 18, 2018

(54) SEMICONDUCTOR DEVICE INCLUDING ELECTRIC AND MAGNETIC FIELD SHIELDING

(71) Applicant: Advanced Semiconductor Engineering, Inc., Kaohsiung (TW)

(72) Inventors: Wei-Hsuan Lee, Kaoshsiung (TW); Chien-Yeh Liu, Kaohsiung (TW); Sung-Mao Li, Kaohsiung (TW); Jaw-Ming Ding, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 134 days.

(21) Appl. No.: 14/730,022

(22) Filed: Jun. 3, 2015

(65) Prior Publication Data

US 2016/0358862 A1 Dec. 8, 2016

(51) Int. Cl.
*H01L 23/552* (2006.01)

(52) U.S. Cl.
CPC .. *H01L 23/552* (2013.01); *H01L 2224/16225* (2013.01); *H01L 2924/181* (2013.01); *H01L 2924/19105* (2013.01)

(58) Field of Classification Search
CPC ........ H01F 27/365; H01F 10/14; H01F 10/26; H01L 23/552; H01L 2224/16225; H01L 2924/181; H01L 2924/19105
See application file for complete search history.

(56) References Cited

U.S. PATENT DOCUMENTS

| 5,371,404 A | 12/1994 | Juskey et al. |
| 5,639,989 A * | 6/1997 | Higgins, III .......... H01L 23/552 174/386 |
| 8,399,964 B2 | 3/2013 | Katti |
| 2003/0175454 A1* | 9/2003 | Lichtenstein ....... H01L 23/3737 428/35.7 |
| 2007/0247268 A1* | 10/2007 | Oya .................... H01F 17/0006 336/200 |
| 2010/0213563 A1* | 8/2010 | Lai ........................ H01L 23/295 257/433 |
| 2012/0236528 A1 | 9/2012 | Le et al. |

(Continued)

OTHER PUBLICATIONS

Kaye&Laby, 2.6.6 Magnetic properties of materials, Dec. 12, 2005, National Physical Laboratory.*

(Continued)

*Primary Examiner* — Marcos D Pizarro
*Assistant Examiner* — Shannon Yi
(74) *Attorney, Agent, or Firm* — Foley & Lardner LLP; Cliff Z. Liu

(57) ABSTRACT

The present disclosure relates to a semiconductor device package and a manufacturing method thereof. The semiconductor device package includes a carrier, at least one electronic component, a first magnetic layer and a second magnetic layer. The carrier has a top surface on which the electronic component is disposed. The first magnetic layer is disposed on the top surface of the carrier and encapsulates the electronic component. The second magnetic layer is disposed on the first magnetic layer and covers a top surface and a lateral surface of the first magnetic layer. A permeability of the first magnetic layer is less than a permeability of the second magnetic layer.

18 Claims, 6 Drawing Sheets

(56) References Cited

U.S. PATENT DOCUMENTS

| | | | |
|---|---|---|---|
| 2015/0123251 A1* | 5/2015 | Chiu | H01L 23/552 |
| | | | 257/659 |
| 2015/0163958 A1* | 6/2015 | Oguma | H05K 7/20463 |
| | | | 264/36.22 |
| 2016/0027740 A1* | 1/2016 | Chiu | H01L 21/4853 |
| | | | 257/659 |

OTHER PUBLICATIONS

Magnetic Susceptibilities of Paramagnetic and Diamagnetic Materials at 20° C., 2001.*
Ceramic Magnetics, Inc., NiZn Materials, 2013.*

* cited by examiner

SEMICONDUCTOR DEVICE INCLUDING ELECTRIC AND MAGNETIC FIELD SHIELDING

BACKGROUND

1. Technical Field

The present disclosure relates generally to semiconductor device packages and manufacturing methods thereof. More particularly, the present disclosure relates to semiconductor device packages with electromagnetic interference shielding and manufacturing methods thereof.

2. Description of the Related Art

Semiconductor devices have become progressively more complex, driven at least in part by the demand for enhanced processing speeds and smaller sizes. While the benefits of enhanced processing speeds and smaller sizes are apparent, these characteristics of semiconductor devices also can create problems. In particular, higher clock speeds can involve more frequent transitions between signal levels, which, in turn, can lead to a higher level of electromagnetic emissions at higher frequencies. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of that neighboring semiconductor device. This phenomenon is sometimes referred to as electromagnetic interference (EMI).

It is against this background that a need arose to develop the semiconductor device packages and related methods described herein.

SUMMARY

In accordance with an embodiment of the present disclosure, a semiconductor device package includes a carrier, at least one electronic component, a first magnetic layer and a second magnetic layer. The carrier has a top surface on which the electronic component is disposed. The first magnetic layer is disposed on the top surface of the carrier, and encapsulates the electronic component. The second magnetic layer is disposed on the first magnetic layer, and covers a top surface and a lateral surface of the first magnetic layer. A permeability of the first magnetic layer is less than a permeability of the second magnetic layer.

In accordance with an embodiment of the present disclosure, a semiconductor device package includes a substrate, a first electronic component, a second electronic component, a first layer and a second layer. The first electronic component and the second electronic component are disposed on the substrate. The first layer includes a first material doped with a magnetic second material, and the first layer is disposed on the substrate and encapsulates the first electronic component. The second layer includes a third material doped with a magnetic fourth material, and the second layer is disposed on the first layer and covers a top surface and a lateral surface of the first layer, and further encapsulates the second electronic component.

In accordance with an embodiment of the present disclosure, a method of manufacturing a semiconductor device package includes providing a carrier having a top surface; attaching at least one electronic component on the top surface of the carrier; forming a first magnetic layer on the top surface of the carrier, thereby covering the electronic component; and forming a second magnetic layer on the first magnetic layer, thereby encapsulating a top surface and a lateral surface of the first magnetic layer. A permeability of the first magnetic layer is less than a permeability of the second magnetic layer.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

A way to reduce EMI is to shield a set of semiconductor devices within a semiconductor device package. For example, shielding can be accomplished by including an electrically conductive casing (or housing) that is electrically grounded and is secured to the exterior of the semiconductor device package. A portion of electromagnetic emissions originating within the casing may be electrically shorted when they strike an inner surface of the casing, thereby reducing the emissions that pass through the casing and adversely affect neighboring semiconductor devices. Similarly, a portion of electromagnetic emissions originating from neighboring semiconductor devices may be electrically shorted when they strike an outer surface of the casing, thereby reducing the emissions that pass through the casing and adversely affect semiconductor devices within the casing.

An electrically conductive casing may block electric field emissions. However, the electrically conductive casing may allow magnetic field emissions to pass.

The shielding described in the present disclosure provides for improved blocking of both electric field and magnetic field emissions.

Figure 1:
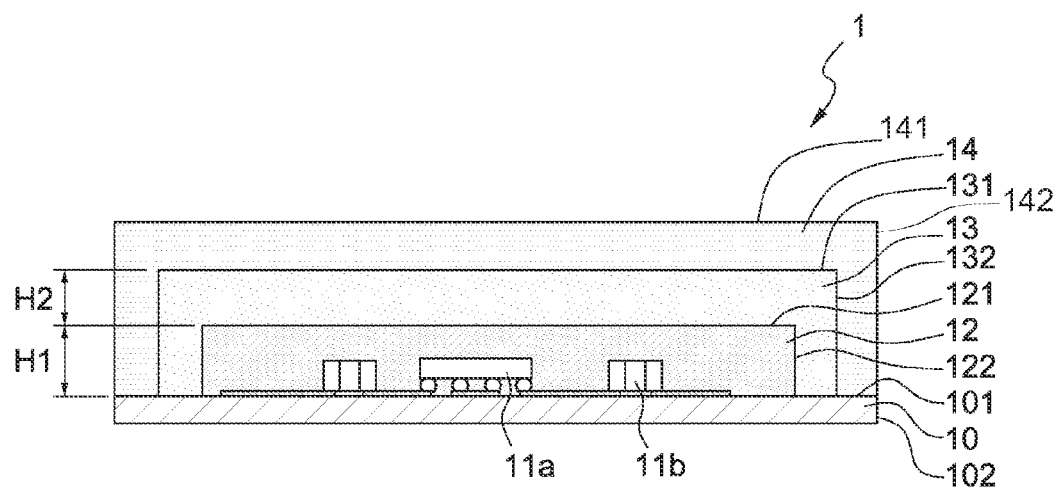
FIG. 1 illustrates a semiconductor device package in accordance with an embodiment of the present disclosure.

FIG. 1 illustrates a cross-sectional view of a semiconductor device package 1 in accordance with an embodiment of the present disclosure. The semiconductor device package 1 includes a substrate 10, two or more electronic components such as electronic components 11a, 11b, a first magnetic layer 12, a second magnetic layer 13 and an electrically conductive layer 14.

The substrate 10 is formed of, for example, a printed circuit board, such as a paper-based copper foil laminate, a composite copper foil laminate, or a polymer-impregnated glass-fiber-based copper foil laminate. The substrate 10 may include a redistribution layer (RDL) or traces for electrical connection between the components mounted on a top surface 101 of the substrate 10. The substrate has a lateral surface 102. The substrate 10 can be replaced by other suitable carriers, such as a leadframe.

The electronic component 11a is disposed on the top surface 101 of the substrate 10. In one or more embodiments, the electronic component 11a is an active component; for example, a chip or a semiconductor die. The electronic component 11a may be electrically connected to the substrate 10 by flip chip bonding, wire-bonding, or both.

The electronic component 11b is disposed on the top surface 101 of the substrate 10. In one or more embodiments, the electronic component 11b is a passive component; for example, a resistor, a capacitor, an inductor or a combination of such components.

The first magnetic layer 12 is disposed on the top surface 101 of the substrate 10 to encapsulate the electronic components 11a, 11b. The first magnetic layer 12 is electrically isolated from the electronic components 11a, 11b. More particularly, the first magnetic layer 12 is an insulating material doped with, or otherwise incorporating, insulating ferrimagnetic particles. In one or more embodiments, the insulating material of the first magnetic layer 12 is an epoxy resin with fillers, a molding compound (e.g., an epoxy molding compound or other molding compound), a polyimide, a phenolic compound or material, a material with a silicone dispersed therein, or a combination thereof. In one or more embodiments, the ferrimagnetic particles include an iron oxide, such as $MFe_2O_4$ (M refers to one of manganese, iron, cobalt, nickel, or zinc, or a combination thereof), or other suitable ferrimagnetic material such as a garnet, hexagonal ferrite, or pyrrhotite.

The second magnetic layer 13 is disposed on the first magnetic layer 12, and encapsulates a top surface 121 and a lateral surface 122 of the first magnetic layer 12. The second magnetic layer 13 is electrically isolated from the electronic components 11a, 11b. More particularly, the second magnetic layer 13 is an insulating material doped with nonconductive ferrimagnetic particles. In one or more embodiments, the insulating material of the second magnetic layer 13 is an epoxy resin with fillers, a molding compound (e.g., an epoxy molding compound or other molding compound), a polyimide, a phenolic compound or material, a material with a silicone dispersed therein, or a combination thereof. The insulating material of the first magnetic layer 12 may be different from the insulating material of the second magnetic layer 13. The insulating ferrimagnetic particles used for doping the first magnetic layer 12 may be different from the insulating ferrimagnetic particles used for doping the second magnetic layer 13.

In one or more embodiments, a thickness H1 of the first magnetic layer 12 is equal to or greater than a thickness H2 of the second magnetic layer 13. In one embodiment, a ratio of the thickness H1 to the thickness H2 is in a range including about 1:0.5 to about 1:1, such as about 1:0.5 to about 1:0.7, about 1:0.5 to about 1:0.9, about 1:0.7 to about 1:0.9, about 1:0.7 to about 1:1, or about 1:0.9 to about 1:1.

The electrically conductive layer 14 is disposed on the second magnetic layer 13 to cover a top surface 131 and a lateral surface 132 of the second magnetic layer 13, forming a conformal shield. In one or more embodiments, the electrically conductive layer 14 is conformally coated on the exterior of the second magnetic layer 13. In one or more embodiments, the electrically conductive layer 14 is a first material doped with, or otherwise incorporating, an electrically conductive second material, such as copper or other suitable material, and, in one or more embodiments, the first material is insulating prior to the doping. In other embodiments, the electrically conductive layer 14 is deposited as a conductive thin film, which may include, for example, aluminum (Al), copper (Cu), chromium (Cr), tin (Sn), gold (Au), silver (Ag), nickel (Ni), stainless steel, or a mixture, an alloy, or other combination thereof. The electrically conductive layer 14 has a top surface 141 and a lateral surface 142. In one or more embodiments, the top surface 141 of the electrically conductive layer 14 is substantially parallel to the top surface 131 of the second magnetic layer 13 and the top surface 121 of the first magnetic layer 12, as illustrated in FIG. 1; however, in other embodiments, the top surfaces 121, 131 and 141 are not parallel. In one or more embodiments, the lateral surface 142 of the electrically conductive layer 14 is substantially aligned with the lateral surface 102 of the substrate 10; however, in other embodiments, the lateral surfaces 102 and 142 are not aligned.

A permeability of the first magnetic layer 12 and the second magnetic layer 13 can be determined by a type and thickness of the respective layers, the types of the doped ferrimagnetic particles in the respective layers, the quantity of the doped ferrimagnetic particles in the respective layers, or by other techniques. Thus, a desired permeability may be achieved by varying the doping and thicknesses of the first magnetic layer 12 and the second magnetic layer 13. In one or more embodiments, a permeability of the first magnetic layer 12 is less than a permeability of the second magnetic layer 13. In one or more embodiments, a ratio of the permeability of the first magnetic layer 12 to the permeability of the second magnetic layer 13 is in a range including about 1:1.2 to about 1:5.0, such as about 1:1.2 to about 1:1.5, about 1:1.2 to about 1:2.0, about 1:1.2 to about 1:3.0, or about 1:1.2 to about 1:4.0. In one or more embodiments, the first permeability is equal to or greater than about 100 Henries per meter (H/m).

In one or more embodiments, a permeability of the first magnetic layer 12 is less than a permeability of the second magnetic layer 13. The use of both the first magnetic layer 12 (an inner shield) with a lower permeability and the second magnetic layer 13 (an outer shield) with a higher permeability, a magnetic saturation effect can be reduced, thereby increasing the EMI shielding capability, especially for low frequency EMI. In one or more embodiments, a permeability of the first magnetic layer 12 is greater than a permeability of the second magnetic layer 13. The permeabilities of the first magnetic layer 12 and the second magnetic layer 13 relative to each other may be adjusted, for example, to provide improved shielding against EMI on sensitive components, or improved shielding of emissions from radiating components.

Figure 2:
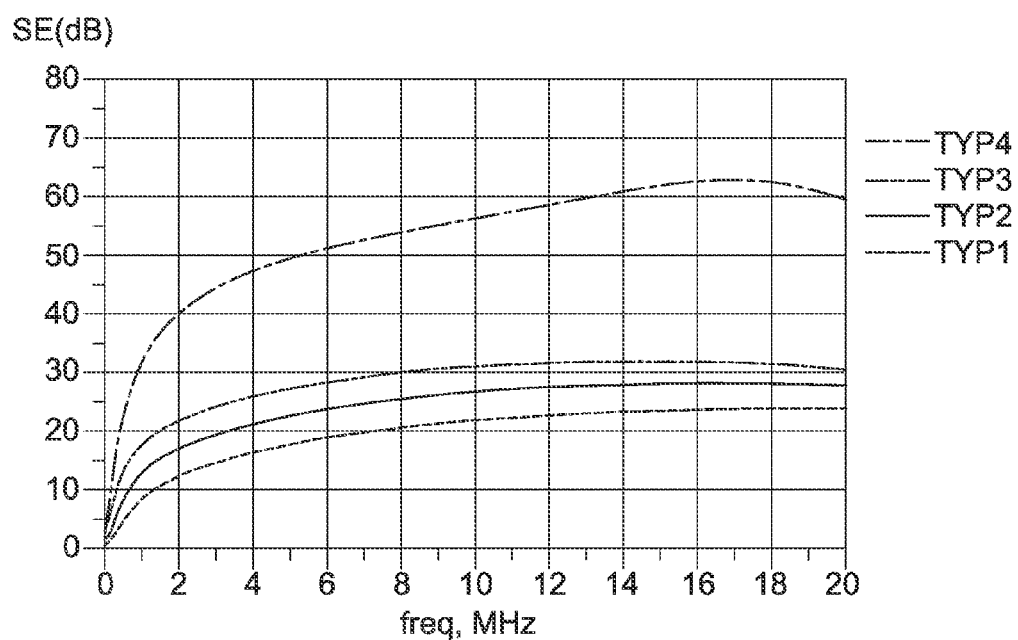
FIG. 2 illustrates experimental results of semiconductor device packages in accordance with embodiments of the present disclosure.

FIG. 2 illustrates experimental results of a shielding effectiveness of four different types of EMI shielding in accordance with the present disclosure. In FIG. 2, the x-axis represents operation frequencies in megahertz (MHz) and the y-axis represents an isolation value in decibels (dB). The four types of EMI shielding in the experiment are labeled as TYP1, TYP2, TYP3 and TYP4. TYP1 includes one magnetic layer (e.g., the first magnetic layer 12) with a permeability of 200 H/m, where the one magnetic layer encapsulates the electronic components (e.g., the electronic components 11a, 11b) of a semiconductor device package. TYP2 includes one magnetic layer (e.g., the first magnetic layer 12) with a permeability of 450 H/m, where the one magnetic layer encapsulates the electronic components (e.g., the electronic components 11a, 11b) of a semiconductor device package. TYP3 includes two magnetic layers (e.g., the first magnetic layer 12 and the second magnetic layer 13), a first layer with a permeability of 200 H/m and a second layer with a permeability of 450 H/m over the first layer, where the two magnetic layers encapsulate the electronic components (e.g., the electronic components 11a, 11b) of a semiconductor device package. TYP4 includes two magnetic layers (e.g., the first magnetic layer 12 and the second magnetic layer 13), a first layer with a permeability of 200 H/m and a second layer with a permeability of 450 H/m over the first layer, together with an electrically conductive layer (e.g., the electrically conductive layer 14) over the second layer, where the two magnetic layers and the electrically conductive layer encapsulate the electronic components (e.g., the electronic components 11a, 11b ) of a semiconductor device package. At an operating frequency of approximately 10 MHz, the isolation values of TYP1, TYP2, TYP3 and TYP4 are, respectively, approximately 22 dB, 26 dB, 31 dB and 57 dB.

According to the experimental results shown in FIG. 2, the TYP4 semiconductor device package (similar to the illustration of FIG. 1) provides for significant improvement in EMI shielding. Further, as can be seen in the experimental results in FIG. 2, the combination of two magnetic layers (TYP3) provides for an improvement in shielding over a single magnetic layer of shielding (TYP1 and TYP2).

Figure 3:
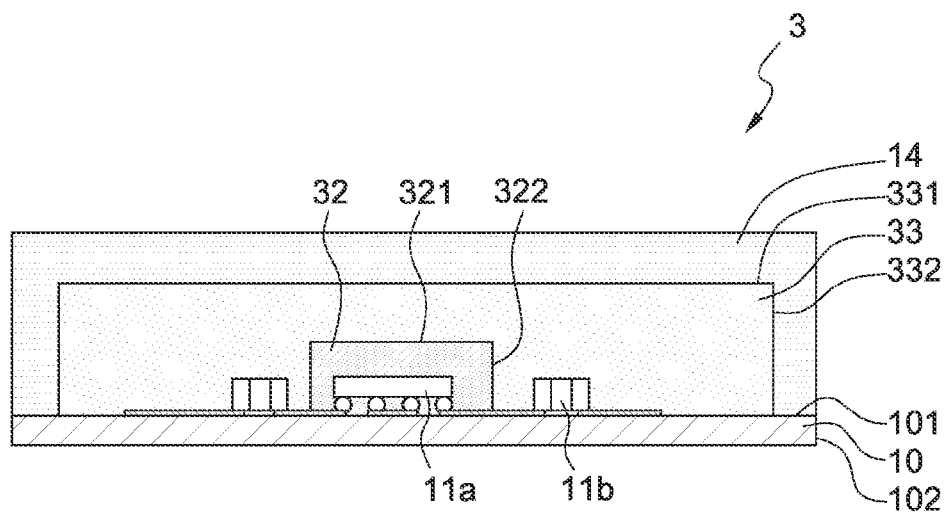
FIG. 3 illustrates a semiconductor device package in accordance with an embodiment of the present disclosure.

FIG. 3 illustrates a cross-sectional view of a semiconductor device package 3 in accordance with an embodiment of the present disclosure. The semiconductor device package 3 shown in FIG. 3 is similar to the semiconductor device package 1 shown in FIG. 1, except that the first magnetic layer 32 shown in FIG. 3 encapsulates a single electronic component 11a rather than encapsulating multiple electronic components (e.g., electronic components 11a, 11b as illustrated in FIG. 1). More generally, the first magnetic layer 32 encapsulates a subset of electronic components, while leaving a remaining subset of electronic components uncovered. A second magnetic layer 33 is disposed on the first magnetic layer 32, and encapsulates a top surface 321 and a lateral surface 322 of the first magnetic layer 32. The electrically conductive layer 14 is disposed on the second magnetic layer 33 to cover a top surface 331 and a lateral surface 332 of the second magnetic layer 33, forming a conformal shield.

In one or more embodiments, the electronic component 11a is a strong electromagnetic radiation source, such as power amplifier; therefore, both the first magnetic layer 32 and a second magnetic layer 33 are used to block the electromagnetic emissions radiated from the electronic component 11a. The electronic component 11b is a weak electromagnetic radiation source; therefore, the second magnetic layer 33 can block the electromagnetic emissions radiated from the electronic component 11b.

As noted, the shielding capability of the first magnetic layer 12 or the second magnetic layer 13 may be changed by adjusting a vertical thickness of the respective layer. An increase in a vertical thickness of the first magnetic layer 12 or the second magnetic layer 13 may also result in an increase in a thickness of the respective first magnetic layer 12 or the second magnetic layer 13 towards respective lateral surfaces (e.g., lateral surfaces 122, 132 in FIG. 1). To reduce a total amount of material used, and thereby reduce package size and manufacturing costs, the first magnetic layer 12 may encapsulate a single electronic component 11 a (as illustrated in FIG. 3) or a subset of components 11a, 11b; and the second magnetic layer 13 may encapsulate the same single electronic component 11a or subset of electronic components 11a, 11b, or may encapsulate different or additional components. For example, in FIG. 3, the first magnetic layer 32 is used to cover the electronic component 11a, which is a strong electromagnetic radiation source, but not the electronic component 11b or other electronic components.

FIGS. 4A-4D illustrate a semiconductor manufacturing process in accordance with an embodiment of the present disclosure.

Figure 4A:
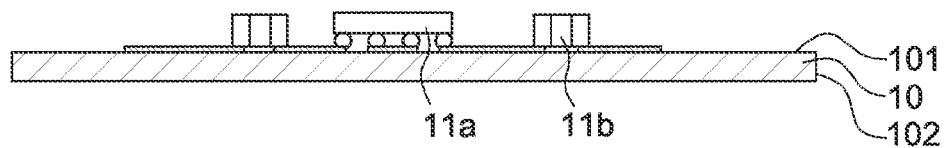
FIG. 4A, FIG. 4B, FIG. 4C and FIG. 4D illustrate a manufacturing process in accordance with an embodiment of the present disclosure.

Referring to FIG. 4A, a substrate 10 is provided. Electronic components 11a, 11b are placed on a top surface 101 of the substrate 10. The substrate 10 is formed of, for example, a printed circuit board, such as a paper-based copper foil laminate, a composite copper foil laminate, or a polymer-impregnated glass-fiber-based copper foil laminate. The substrate 10 may include an RDL or traces for electrical connection between the electronic components 11a, 11b mounted on the top surface 101 of the substrate 10.

Figure 4B:
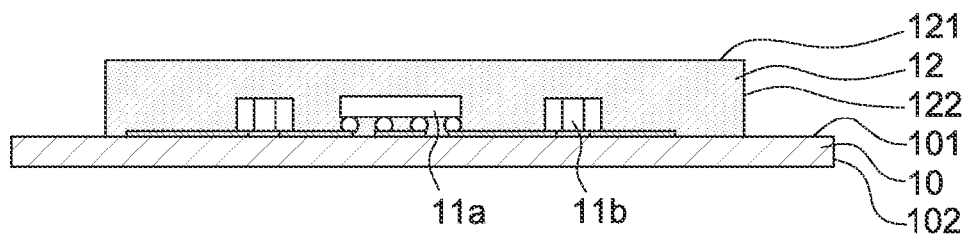

Referring to FIG. 4B, a first magnetic layer 12 is formed on the top surface 101 of the substrate 10 to encapsulate the electronic components 11a, 11b. The first magnetic layer 12 may be formed using a molding technique, such as a transfer molding technique or a compression molding technique. The first magnetic layer 12 is formed of a an insulating material doped with insulating ferrimagnetic particles. In one or more embodiments, the insulating material is an epoxy resin with fillers, a molding compound (e.g., an epoxy molding compound or other molding compound), a polyimide, a phenolic compound or material, a material with a silicone dispersed therein, or a combination thereof. In one or more embodiments, the ferrimagnetic particles comprise an iron oxide, such as $MFe_2O_4$ (M refers to one of manganese, iron, cobalt, nickel, or zinc, or a combination thereof), or other suitable ferrimagnetic material such as a garnet, hexagonal ferrite, or pyrrhotite.

Figure 4C:
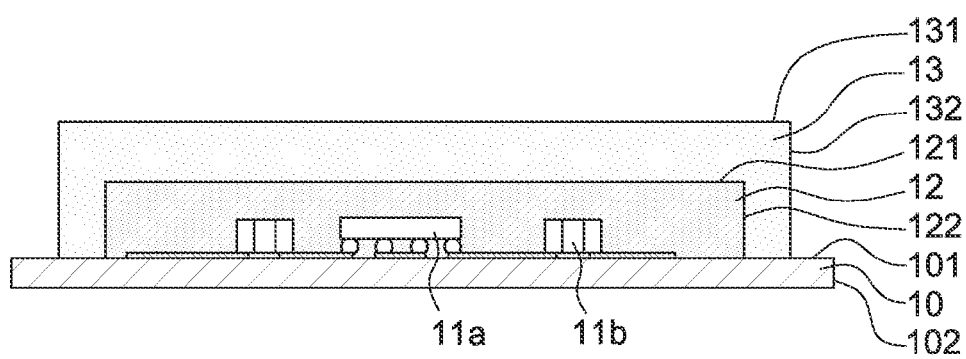

Referring to FIG. 4C, a second magnetic layer 13 is formed on the first magnetic layer 12 to encapsulate a top surface 121 and a lateral surface 122 of the first magnetic layer 12. The second magnetic layer 13 may be formed using a molding technique, such as a transfer molding technique or a compression molding technique. The second magnetic layer 13 is formed of an insulating material doped with, or otherwise including, insulating ferrimagnetic particles. In one or more embodiments, the insulating material is an epoxy resin with fillers, a molding compound (e.g., an epoxy molding compound or other molding compound), a polyimide, a phenolic compound or material, a material with a silicone dispersed therein, or a combination thereof. In one or more embodiments, a thickness H1 of the first magnetic layer 12 is equal to or greater than a thickness H2 of the second magnetic layer 13. In one or more embodiments, a ratio of the thickness H1 to the thickness H2 is in a range including about 1:0.5 to about 1:1, such as about 1:0.5 to about 1:0.7, about 1:0.5 to about 1:0.9, about 1:0.7 to about 1:0.9, about 1:0.7 to about 1:1, or about 1:0.9 to about 1:1. In one or more embodiments, a thickness of the first magnetic layer 12 is less than a thickness of the second magnetic layer 13.

Figure 4D:
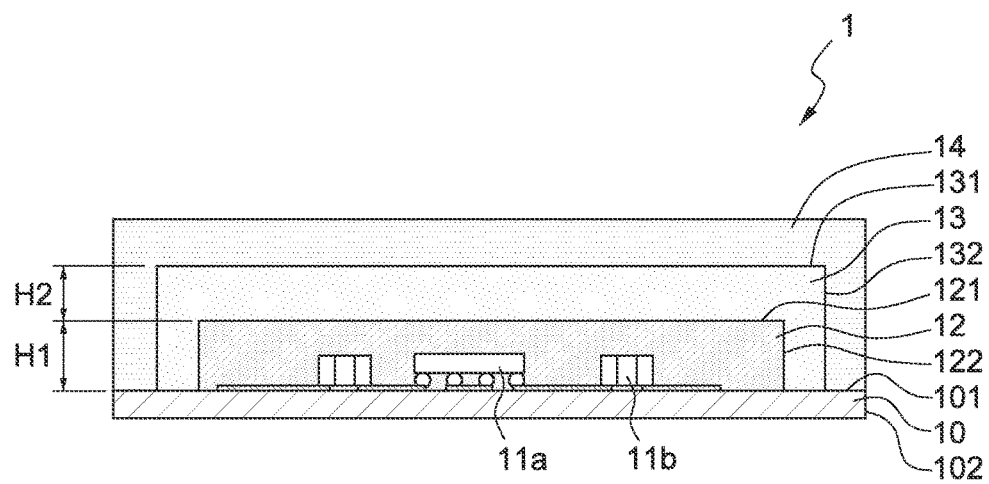

Referring to FIG. 4D, an electrically conductive layer 14 is formed on the second magnetic layer 13 to form the semiconductor device package 1 shown in FIG. 1. The electrically conductive layer 14 covers a top surface 131 and a lateral surface 132 of the second magnetic layer 13. In one or more embodiments, the electrically conductive layer 14 may be formed using a molding technique, such as a transfer molding technique or a compression molding technique. In one or more embodiments, the electrically conductive layer 14 is formed of a first material doped with an electrically conductive second material; and in one or more embodiments, the first material is insulating prior to the doping. In other embodiments, the electrically conductive layer 14 is deposited as a conductive thin film, which may include, for example, Al, Cu, Cr, Sn, Au, Ag, Ni, stainless steel, or a mixture, an alloy, or other combination thereof FIGS. 5A-5D illustrate a semiconductor manufacturing process in accordance with an embodiment of the present disclosure. The manufacturing process shown in FIGS. 5A-5D is similar to that shown in FIGS. 4A-4D, except that in FIG. 5B, the first magnetic layer 32 is formed to encapsulate a single electronic component 11a (rather than multiple electronic components as illustrated in FIG. 4B). For example, electronic component 11a may be a strong electromagnetic radiation source, such as power amplifier, or may be a component sensitive to EMI. In FIG. 5C, similarly to FIG. 4C, the second magnetic layer 33 is formed to encapsulate the first magnetic layer 32 (including a top surface 321 and a lateral surface 322, and thus the electronic component 11a), and further encapsulates the electronic component 1 1b; and in FIG. 5D, similarly to FIG. 4D, the electrically conductive layer 14 is formed on the second magnetic layer 33 (including a top surface 331 and a side surface 332), forming a conformal shield. Thus, the semiconductor device package 3 shown in FIG. 3 is formed.

Figure 5A:
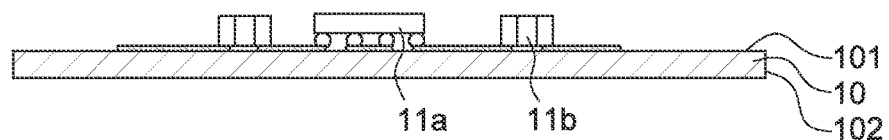
FIG. 5A, FIG. 5B, FIG. 5C and FIG. 5D illustrate a manufacturing process in accordance with an embodiment of the present disclosure.
Figure 5B:
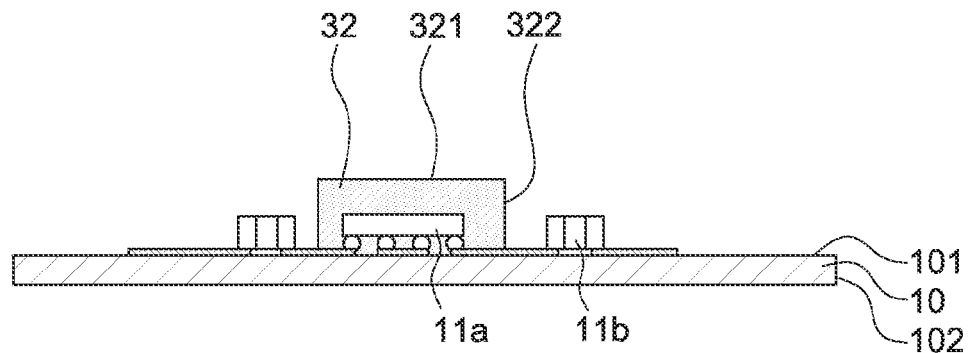
Figure 5C:
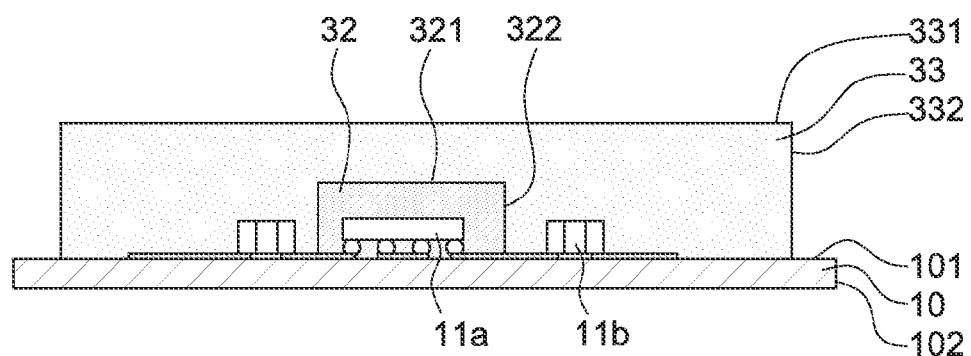
Figure 5D:
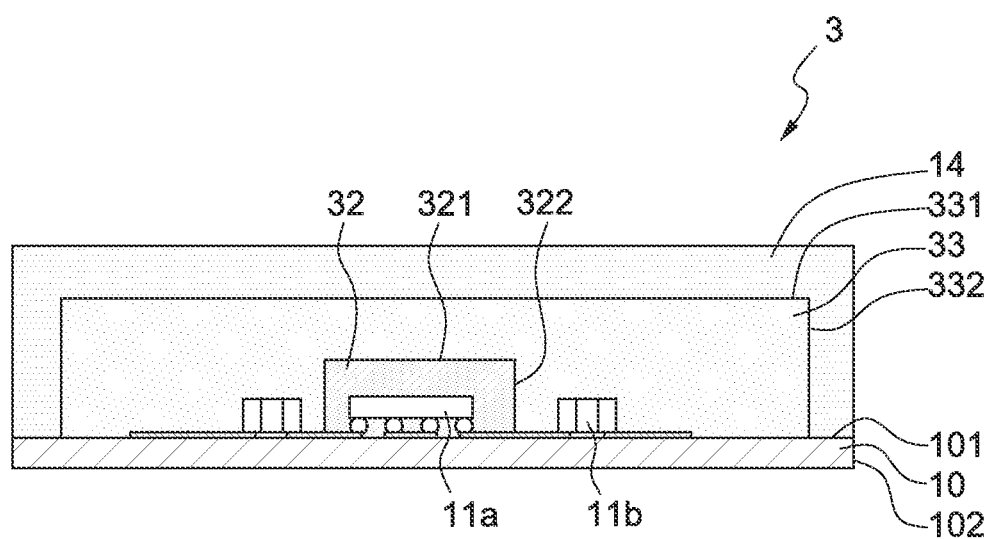

In FIG. 5B, the first magnetic layer 32 can be formed using an irregular molding technique or a selective molding technique. By using the first magnetic layer 32 to selectively cover the single electronic component 11a, the semiconductor device package 3 shown in FIG. 5D includes less material for the first magnetic layer 32 than does the semiconductor device package 1 shown in FIG. 4D, thereby reducing manufacturing costs.

As used herein, the terms "substantially," "approximately" and "about" are used to denote small variations. When used in conjunction with an event or circumstance, the terms can refer to instances in which the event or circumstance occurs precisely, as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Thus, for example, the term "approximately 10 MHz" can refer to a frequency that is within ±1% of 10 MHz; and the term "approximately 22 dB" can refer to a measurement that is within ±0.5% of 22 dB. For another example, the term "substantially parallel" with respect to two surfaces can refer to an angle of a plane of a first of the surfaces with respect to an axis being within ±10%, ±5%, ±4%, ±3%, ±2%, ±1%, ±0.5%, ±0.1%, or ±0.05% of an angle of a plane of a second of the surfaces with respect to the same axis; and the term "substantially aligned" with respect to two surfaces can refer to displacement between the two surfaces of no greater than 5 μm, no greater than 2 μm, no greater than 1 μm, or no greater than 0.5 μm.

Additionally, amounts, ratios, and other numerical values are sometimes presented herein in a range format. It can be understood that such range formats are used for convenience and brevity, and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a carrier having a top surface;
   a first electronic component disposed on the top surface of the carrier;
   a second electronic component disposed on the top surface of the carrier;
   a first magnetic layer disposed on the top surface of the carrier and encapsulating the first electronic component, wherein the second electronic component is exposed from the first magnetic layer;
   a second magnetic layer disposed on the first magnetic layer and covering a top surface of the first magnetic layer and a lateral surface of the first magnetic layer, wherein a permeability of the first magnetic layer is less than a permeability of the second magnetic layer; and
   an electrically conductive layer disposed on the second magnetic layer and covering a top surface of the second magnetic layer, a lateral surface of the second magnetic layer and at least a portion of the top surface of the carrier.

2. The semiconductor device package according to claim 1, wherein the permeability of the first magnetic layer is equal to or greater than 100 Henries per meter.

3. The semiconductor device package according to claim 1, wherein a thickness of the first magnetic layer is equal to or greater than a thickness of the second magnetic layer.

4. The semiconductor device package according to claim 1, wherein each of the first magnetic layer and the second magnetic layer comprises insulating ferrimagnetic particles.

5. The semiconductor device package according to claim 1, wherein the second electronic component is exposed from the first magnetic layer and encapsulated by the second magnetic layer.

6. The semiconductor device package according to claim 1, wherein a ratio of the permeability of the first magnetic layer to the permeability of the second magnetic layer is in a range including about 1:1.2 to about 1:5.

7. The semiconductor device package according to claim 1, wherein the second magnetic layer covers at least another portion of the top surface of the carrier.

8. The semiconductor device package according to claim 3, wherein a ratio of the thickness of the first magnetic layer to the thickness of the second magnetic layer is in a range including about 1:0.5 to about 1:1.

9. The semiconductor device package according to claim 4, wherein the insulating ferrimagnetic particles of one or both of the first magnetic layer and the second magnetic layer comprise iron oxides.

10. A semiconductor device package, comprising:
a substrate;
a first electronic component disposed on the substrate;
a second electronic component disposed on the substrate;
a first layer including a first material doped with a magnetic second material, the first layer disposed on the substrate and encapsulating the first electronic component, wherein the second electronic component is exposed from the first layer; and
a second layer including a third material doped with a magnetic fourth material, the second layer disposed on the first layer and covering a top surface and a lateral surface of the first layer, and further encapsulating the second electronic component;
wherein a permeability of the first layer is equal to or greater than 100 Henries per meter, and the permeability of the first layer is less than a permeability of the second layer.

11. The semiconductor device package according to claim 10, further comprising a conformal shield disposed on the second layer and covering a top surface and a lateral surface of the second layer.

12. The semiconductor device package according to claim 10, wherein a ratio of a thickness of the first layer to a thickness of the second layer is in a range including about 1:0.5 to about 1:1.

13. The semiconductor device package according to claim 10, wherein the magnetic second material is different from the magnetic fourth material.

14. A method of manufacturing a semiconductor device package, the method comprising:

(a) providing a carrier having a top surface;
(b) attaching a first electronic component and a second electronic component on the top surface of the carrier;
(c) forming a first magnetic layer on the top surface of the carrier, the first magnetic layer encapsulating the first electronic component and exposing the second electronic component;
(d) forming a second magnetic layer on the first magnetic layer, the second magnetic layer covering a top surface of the first magnetic layer and a lateral surface of the first magnetic layer, wherein a permeability of the first magnetic layer is less than a permeability of the second magnetic layer; and
(e) forming an electrically conductive layer on the second magnetic layer, the electrically conductive layer covering a top surface of the second magnetic layer, a lateral surface of the second magnetic layer and at least a portion of the top surface of the carrier.

15. The method according to claim 14, wherein the permeability of the first magnetic layer is equal to or greater than 100 Henries per meter.

16. The method according to claim 14, wherein each of the first magnetic layer and the second magnetic layer are doped with an insulating ferrimagnetic compound.

17. The method according to claim 14, wherein the electrically conductive layer is doped with an electrically conductive material.

18. The method according to claim 14, wherein a ratio of the permeability of the first magnetic layer to the permeability of the second magnetic layer is in a range including about 1:1.2 to about 1:5.

* * * * *